(12) United States Patent
Takamine

(10) Patent No.: US 7,397,327 B2
(45) Date of Patent: Jul. 8, 2008

(54) SURFACE ACOUSTIC WAVE FILTER AND METHOD OF PRODUCING THE SAME

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 261 days.

(21) Appl. No.: 10/554,622

(22) PCT Filed: Apr. 4, 2005

(86) PCT No.: PCT/JP2005/006608

§ 371 (c)(1),
(2), (4) Date: Oct. 26, 2005

(87) PCT Pub. No.: WO2005/099090

PCT Pub. Date: Oct. 20, 2005

(65) Prior Publication Data

US 2006/0202780 A1 Sep. 14, 2006

(30) Foreign Application Priority Data

Apr. 8, 2004 (JP) .............................. 2004-113881

(51) Int. Cl.
*H03H 9/10* (2006.01)
(52) U.S. Cl. ..................... 333/193; 310/313 R; 310/340
(58) Field of Classification Search ......... 333/193–195; 310/313 R, 340
See application file for complete search history.

(56) References Cited

U.S. PATENT DOCUMENTS

| 3,781,721 A | * | 12/1973 | Judd et al. | ................... 333/151 |
| 6,570,469 B2 | * | 5/2003 | Yamada et al. | ............... 333/193 |
| 2002/0159242 A1 | * | 10/2002 | Nakatani et al. | ............ 361/760 |

FOREIGN PATENT DOCUMENTS

| JP | 55-41048 | | 3/1980 |
| JP | 58-077921 U | | 5/1983 |
| JP | 60-176317 | | 9/1985 |
| JP | 62-257210 | * | 11/1987 |
| JP | 03-036219 U | | 4/1991 |
| JP | 04-087410 | | 3/1992 |
| JP | 10-041438 | | 2/1998 |
| JP | 2000-312127 | | 11/2000 |
| JP | 2002-198487 | | 7/2002 |
| JP | 2003-17979 | | 1/2003 |
| JP | 2003-032061 | | 1/2003 |
| JP | 2003-204032 | | 7/2003 |

* cited by examiner

*Primary Examiner*—Barbara Summons
(74) *Attorney, Agent, or Firm*—Keating & Bennett, LLP

(57) ABSTRACT

A surface acoustic wave filter includes a device chip, one principal surface of a piezoelectric substrate having a wiring pattern including IDTs and pads electrically connected to the IDTs, that is disposed so as to oppose a mount board, with the pads being electrically connected to lands of the mount board through bumps. A resin film covers the other principal surface of the piezoelectric substrate and the principal surface of the mount board to seal the device chip. In the piezoelectric substrate, the area of the one principal surface is greater than the area of the other principal surface.

8 Claims, 4 Drawing Sheets

SURFACE ACOUSTIC WAVE FILTER AND METHOD OF PRODUCING THE SAME

BACKGROUND OF THE INVENTION

1. Field of the Invention

The present invention relates to a surface acoustic wave filter and a method of producing the same.

2. Description of the Related Art

As with conventionally used large scale integrations (LSIs), various packages having external dimensions that are approximately the same as those of chip size packages (CSPs) have been used for surface acoustic wave filters, that is, device chips have been provided.

For example, a surface acoustic wave filter 1 shown in cross-section in FIG. 1A includes a device chip 10x mounted to a mount board 2 having an external terminal (not shown) by a flip chip pound mounting method. The device chip 10x is sealed with a resin film 6 such that a space is provided at a vibratory portion (surface acoustic wave propagation portion) of the device chip 10x. The device chip 10x includes a wiring pattern provided on one surface 11a of a piezoelectric substrate 11x which includes, for example, pads 16 and comb electrodes (IDTs) 14. Lands 3, which are metallic portions electrically connected to the external terminal of the mount board 2, and the pads 16 of the device chip 10x are electrically connected through bumps 4, such as metallic bumps including Au bumps or solder bumps.

The surface acoustic wave filter sealed by the resin film 6 in this manner is typically fabricated by a heat press method as shown in FIG. 2. More specifically, after mounting a plurality of device chips 10x to one board aggregate 2x by the flip chip pound mounting method, the device chips 10x are covered with the resin film 6. While heating the resin film 6, the resin film 6 is pressed in the direction of arrows 9 with a hot press 8 or by roll lamination. The resin film 6 softened by heat is pressed in contact with the mount board 2x at spaces between the device chips 10x that are adjacent to each other, and the device chips 10x are embedded in the resin film 6. By simultaneously dicing portions of the aggregate board 2x and portions of the resin film 6 between the adjacent device chips 10x, packages are severed into individual packages (see, for example, Japanese Unexamined Patent Application Publication No. 2003-17979 (Patent Document 1) and Japanese Unexamined Patent Application Publication No. 2003-32061 (Patent Document 2).

However, when the resin film 6 is pressed with the hot press 8 or by roll lamination, air enters between the resin film 6 and peripheral surfaces 12x extending between a pair of principal surfaces of each piezoelectric substrate 11x. As a result, large voids 6x are formed near portions at which the resin film 6 is in close contact with the board aggregate 2x, that is, the mount board 2.

More specifically, since the peripheral surfaces 12x of each piezoelectric substrate 11x are perpendicular to the pair of principal surfaces, at the initial stage of heat pressing the resin film 6, the resin film 6 is separated from the peripheral surfaces 12x of each piezoelectric substrate 11x. As a result, as shown in FIG. 1B, the voids 6x are formed due to air entering the corners or longer sides of each rectangular piezoelectric substrate 11x.

When such large voids 6x are formed, the sealing width of the surface acoustic wave filter 1 (that is, the size of a portion at which the film 6 and the mount board 2 are in close contact between the outside and the internal space of the surface acoustic wave filter 1) is reduced. Therefore, the surface acoustic wave filter 1 is less reliable, particularly in terms of moisture resistance.

SUMMARY OF THE INVENTION

To overcome the problems described above, preferred embodiments of the present invention provide a surface acoustic wave filter which prevents the formation of large voids when heating and pressing a resin sheet covering a device chip, and a method of producing the same.

According to a preferred embodiment of the present invention, a surface acoustic wave filter is provided which includes a mount board having a land, a device chip, and a resin film. In the device chip, a wiring pattern including an IDT and a pad electrically connected to the IDT is provided on one of a pair of parallel and opposing principal surfaces of a piezoelectric substrate, the pad being disposed so as to oppose the land of the mount board and the pad and the land being electrically connected through a bump. In the surface acoustic wave filter, the resin film covers the other principal surface of the piezoelectric substrate and seals the device chip. The area of the one of the principal surfaces of the piezoelectric substrate is greater than the area of the other principal surface. The area of the other principal surface is reduced by removing a portion near an outer edge of the other principal surface of the piezoelectric substrate.

With the above-described structure, the area of the other principal surface of the piezoelectric substrate covered with the resin film is less than the area of the one of the principal surfaces of the piezoelectric substrate to which the resin film extends to later by heat pressing performed to press the heated resin film. Therefore, during the heat pressing, the resin film extends along the peripheral surfaces extending between the pair of principal surfaces of the piezoelectric substrate to the greatest extent possible. Thus, the sealing width is greatly increased and the formation of large voids is prevented.

The structure described above may have various configurations.

It is desirable that peripheral surfaces of the piezoelectric substrate extending between the pair of principal surfaces include a parallel planar portion and a vertical planar portion, such that the peripheral surfaces of the piezoelectric substrate include a stepped portion including at least one step. Each parallel planar portion is substantially parallel to the pair of principal surfaces of the piezoelectric substrate and each vertical planar portion is substantially perpendicular to the pair of principal surfaces of the piezoelectric substrate.

In this case, during heat pressing, the resin film contacts at least the parallel flat portion of each of the peripheral surfaces of the piezoelectric substrate. Therefore, although large voids may form when air continues to enter the resin film at the initial stage of the heat pressing, according to the above-described structure, the air does not continue to enter the resin film, such that, even if air enters the resin film, air bubbles that are formed are divided at the stepped portion of each of the peripheral surfaces of the piezoelectric substrate. Sealing is adversely affected by the voids formed by air bubbles at a final step of the one of the principal surfaces of the piezoelectric substrate, and the size of these voids is greatly reduced.

It is also desirable that peripheral surfaces of the piezoelectric substrate extending between the pair of principal surfaces include a tapered portion extending along an outer edge of the other principal surface of the piezoelectric substrate.

According to this structure, at the initial stage of heat pressing, air does not readily enter the resin film because the resin film gradually comes into contact with each tapered portion. Since, from the initial stage of the heat pressing, the resin film does not separate from the peripheral surfaces of the piezoelectric substrate and continue to take in air, the formation of large voids is prevented.

It is further desirable that peripheral surfaces of the piezoelectric substrate extending between the pair of principal surfaces include a curved portion extending along an outer edge of the other principal surface of the piezoelectric substrate.

According to the structure, since, at the initial stage of heat pressing, the resin film gradually comes into contact with the curved portion, the air does not readily enter the resin film. Since, at the initial stage of the heat pressing, the resin film does not separate from the peripheral surfaces of the piezoelectric substrate and continue to take in air, the formation of large voids is prevented.

Another preferred embodiment of the present invention provides a method of producing a surface acoustic wave filter having the following unique features.

According to this preferred embodiment of the present invention, a method of producing surface acoustic wave filters is provided which preferably includes four steps. In the first step, a plurality of device chips are produced, each device chip having a wiring pattern formed on one of a pair of opposing principal surfaces of a piezoelectric substrate, each wiring pattern including an IDT and a pad electrically connected to the IDT. In the second step, the plurality of device chips are spaced apart from each other and mounted to a board aggregate by disposing the one of the principal surfaces of each device chip so as to oppose the board aggregate and electrically connecting the one of the principal surfaces of each device chip to the board aggregate through a bump. In the third step, the device chips are sealed with a resin film by covering the device chips mounted to the board aggregate with the resin film and heating and pressing the resin film. In the fourth step, the surface acoustic wave filters are severed from each other by cutting portions of the resin film and the board aggregate between the device chips adjacent to each other. The first step preferably includes a step of forming the one of the principal surfaces of each piezoelectric substrate so as to have an area that is greater than the area of the other principal surface of each piezoelectric substrate by removing a portion of each piezoelectric substrate near an outer edge of the other principal surface.

According to the above-described method, in the third step, the area of the other principal surface of each piezoelectric substrate is less than the area of the one of the principal surfaces of each piezoelectric substrate to which the resin film later extends, such that the resin film extends along the peripheral surfaces of the piezoelectric substrates to the greatest extent possible. This prevents the reduction of the sealing width by preventing the formation of large voids.

According to the surface acoustic wave filter and the method of producing the same according to various preferred embodiments of the present invention, the formation of large voids is prevented when heating and pressing a resin sheet covering a device chip.

These and other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereafter, preferred embodiments of the present invention will be described with reference to FIGS. 3 to 8.

Figure 1A:
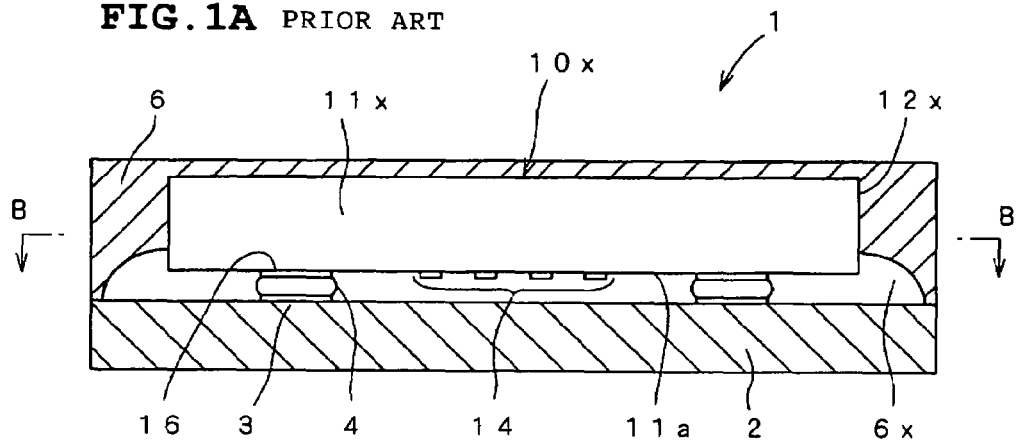
FIGS. 1A and 1B are views of the structure of a surface acoustic wave filter according to the related art.
Figure 1B:
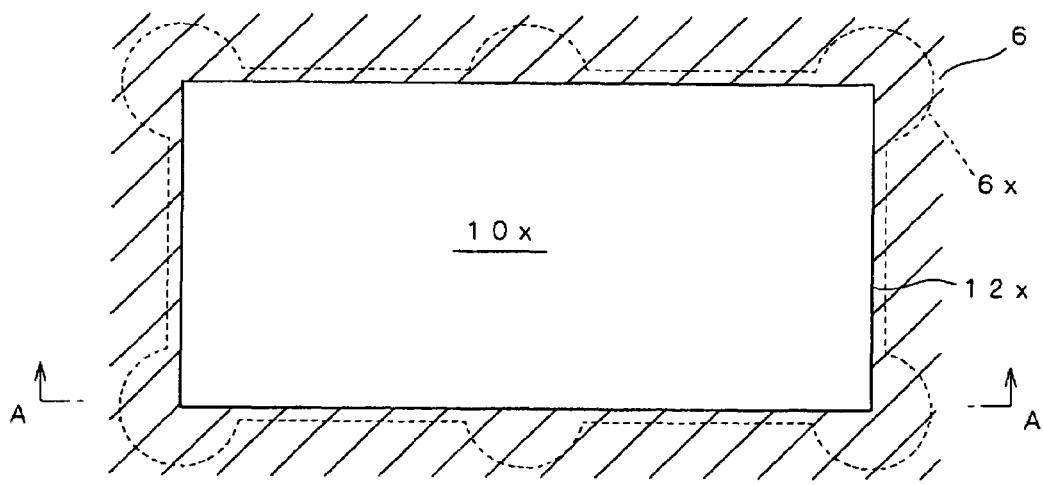
Figure 2:
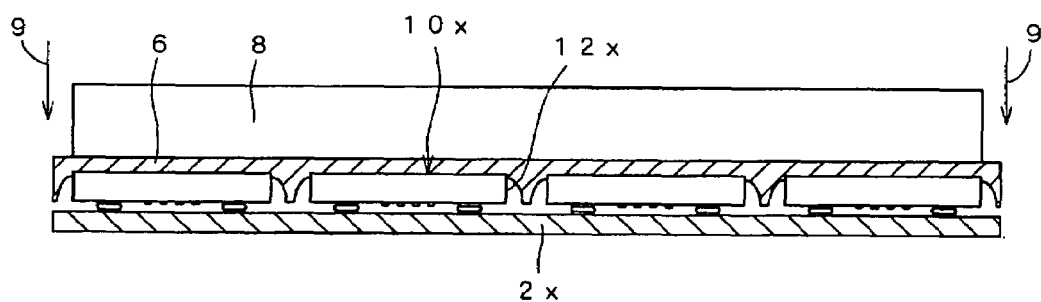
FIG. 2 illustrates a method of producing surface acoustic wave filters according to the related art.

A surface acoustic wave filter 1a according to a first preferred embodiment will be described with reference to FIGS. 3, 4, and 8. Elements corresponding to those of the related example shown in FIGS. 1 and 2 are denoted by the same reference numerals.

Figure 3:
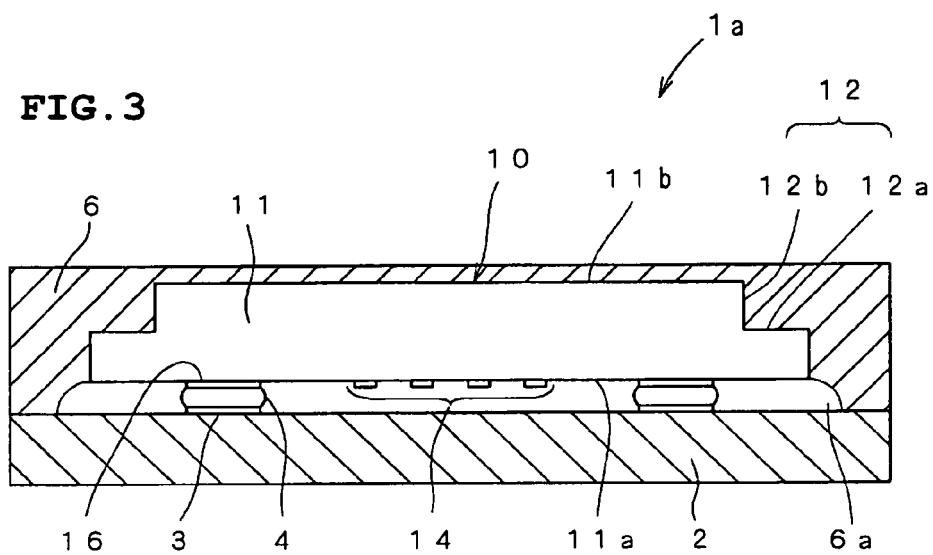
FIG. 3 is a sectional view of the structure of a surface acoustic wave filter according to a preferred embodiment of the present invention.

As shown in cross section in FIG. 3, the surface acoustic wave filter 1a includes a device chip 10 which is mounted to a mount board 2 having an external terminal (not shown) by a flip chip pound mounting method, and is sealed with a resin film 6.

The device chip 10 includes a wiring pattern made of a metallic film and disposed on one of a pair of parallel and opposing principal surfaces of a piezoelectric substrate 11, that is, a principal surface 11a. The wiring pattern includes, for example, IDTs 14, which are comb electrodes, and pads 16 electrically connected to the IDTs 14. The piezoelectric substrate 11 is made of a crystal material, such as $LiTaO_3$ or $LiNbO_3$.

The mount board 2 includes the external terminal (not shown) disposed on one of a pair of parallel and opposing principal surfaces and lands 3, which are metallic portions, disposed on the other principal surface. The external terminal and the lands 3 are electrically connected. The lands 3 are preferably made of, for example, Au.

The device chip 10 is arranged such that the principal surface 11a having the wiring pattern provided thereon opposes the principal surface of the mount board 2 having the lands 3 provided thereon, and the pads 16 of the device chip 10 and the lands 3 of the mount board 12 are electrically connected through bumps 4, such as metallic bumps including Au bumps or solder bumps. The thickness of the bumps 4 provides a gap between the device chip 10 and the mount board 12 such that a surface acoustic wave propagation portion of the principal surface 11a of the piezoelectric substrate 11 is not constrained.

Unlike the related example, the area of the principal surface 11b of the piezoelectric substrate 11 not having the wiring pattern provided thereon is less than the area of the principal surface 11a having the wiring pattern provided thereon. Stepped portions 12 are provided at the peripheral surfaces extending between the principal surfaces 11a and 11b. Each stepped portion 12 includes a parallel planar portion 12a and a vertical planar portion 12b, the parallel planar portion 12a being parallel to the principal surfaces 11a and 11b of the piezoelectric substrate 10, and the vertical planar portion 12b being perpendicular to the principal surfaces 11a and 11b of the piezoelectric substrate 10. Although, in FIG. 3, each stepped portion 12 includes only one step, two or more steps may be provided.

Each of the stepped portions 12 of the piezoelectric substrate 11 may be formed by, for example, dicing. More specifically, in a dicing step in which individual device chips 10 are severed from a wafer for the piezoelectric substrate 11, after forming a protective film of resist resin on the principal surface 11a of each piezoelectric substrate 11 having the wiring pattern formed thereon, grooves of predetermined depths are formed in the wafer for each piezoelectric substrate 11 from the principal surface 11b of each piezoelectric substrate 11 not having the wiring pattern formed thereon. After peeling off the resist resin of the protective layer and forming the bumps 4 of Au or other suitable material, onto the pads 16, the device chips 10 are severed along the grooves, while portions of the grooves remain, thereby severing the device chips 10 from each other. The portions of the grooves that remain in the device chips 10 define the stepped portions 12 of the piezoelectric substrates 11. Since the thickness of the edges of the piezoelectric substrates 11 including the grooves is reduced (stepped portions 12), the edges tend to break as the depths of the grooves increase. Thus, it is desirable for the depth of cut of the grooves to be substantially 50%±15% of the thickness of the wafer for each piezoelectric substrate 11.

As a different method of forming the stepped portions 12 at the piezoelectric substrates 11, it is possible to use, for example, acid etching or dry etching using Ar gas. In this case, an etching mask defined by a resist resin pattern including an opening at a portion corresponding to the grooves defining the stepped portions 12 of the piezoelectric substrate 11 is formed on the wafer for the piezoelectric substrates 11 by, for example, printing or photolithography.

Figure 4:
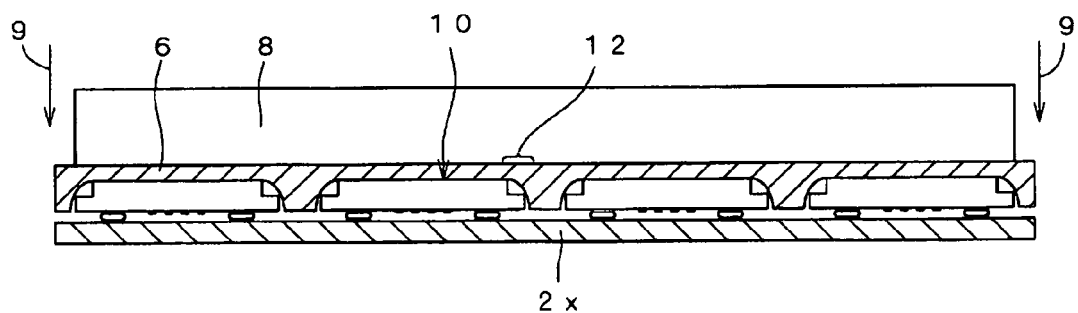
FIG. 4 illustrates a method of producing surface acoustic wave filters according to another preferred embodiment of the present invention.

As shown in FIG. 4, surface acoustic wave filters 1a are preferably fabricated by the heat press method.

First, the device chips 10 are mounted to one board aggregate 2x by the flip chip pound mounting method with spaces between the device chips 10 that are adjacent to each other. In other words, the bumps 4 previously formed on the pads 16 are joined to the lands 3 by contacting the bumps 4 with the lands 3 while applying heat or ultrasonic waves.

Next, the device chips 10 are covered with the resin film 6, and, while heating the resin film 6, the resin film 6 is pressed towards the board aggregate 2x in the direction of arrows 9 with a hot press 8 or by roll lamination. The resin film 6 that is softened by heat is pressed so as to extend to the mount board 2x in the spaces between the adjacent device chips 10, and the device chips 10 are embedded in the resin film 6.

Next, portions of the resin film 6 and portions of the board aggregate 2x between the adjacent device chips 10 are simultaneously diced perpendicularly to the substrate aggregate 2x, such that the surface acoustic wave filters 1a are severed from each other.

Unlike the related example, the surface acoustic wave filters 1a are provided with the stepped portions 12 in the piezoelectric substrates 11. Therefore, when the resin film 6 is subjected to the heat pressing performed to press the heated resin film 6, the resin film 6 contacts the parallel planar portions 12a of the stepped portions 12 of the piezoelectric substrates 11. Large voids occur when air enters the resin film from the initial stage of the heat pressing. However, in the present preferred embodiment, the air does not continue to enter the resin film due to the parallel planar portions 12a. Consequently, even if air enters the resin film 6, air bubbles that are formed are divided at the stepped portions 12 of the piezoelectric substrates 11, such that the volume of air enters is greatly reduced. As a result, the voids 6a that affect the sealing width are greatly reduced. This provides a sealing width that is greater than that in the related example, such that the filters are more reliable, especially in terms of moisture resistance.

In a specific example, the gap between the device chip 10 and the mount board 2 is approximately 19 μm. When the device chips 11 are mounted to the board aggregate 2x, the adjacent device chips 11 are spaced apart at an interval in the range of approximately 300 μm to approximately 800 μm. The initial thickness of the resin film 6 used to cover the device chip 11 is approximately 250 μm.

Figure 8:
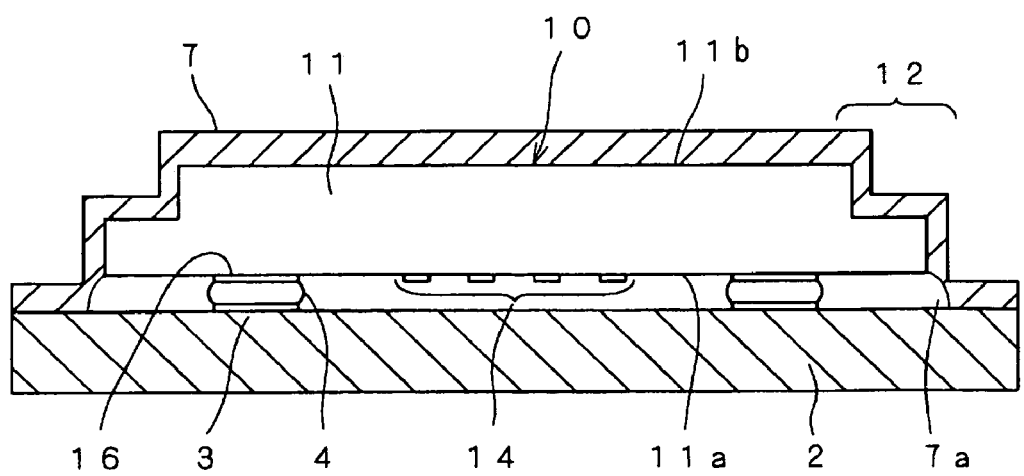
FIG. 8 is a sectional view of another modification of the surface acoustic wave filter according to a preferred embodiment of the present invention.

Although, in the example shown in FIGS. 3 and 4, the sealing is performed using a relatively thick resin film 6, a relatively thin resin film 7 may also be used as shown in FIG. 8. Even if the relatively thin resin film 7 is used for sealing, voids 7a are greatly reduced, such that the filter is more reliable, especially in terms of moisture resistance. In this case, a hot press or roller may have a surface that corresponds to the external configuration (principal surfaces 11b and stepped portions 12) of the piezoelectric substrates 11.

Next, a second preferred embodiment will be described with reference to FIGS. 5 to 7.

Figure 5:
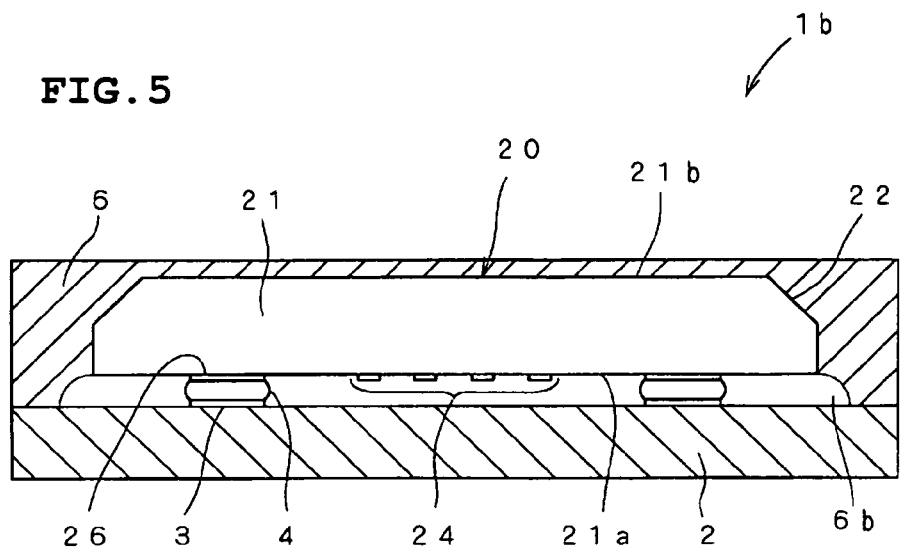
FIG. 5 is a sectional view of the structure of a surface acoustic wave filter according to another preferred embodiment of the present invention.

As shown in cross section in FIG. 5, a surface acoustic wave filter 1b having substantially the same structure as the filter of the first preferred embodiment includes a device chip 20 that is mounted to a mount board 2 by the flip chip pound mounting method, and that is covered with a resin film 6. A wiring pattern including IDTs 24 and pads 26 is formed on a principal surface 21a of a piezoelectric substrate 21. The pads 26 are electrically connected to the mount board 2 through bumps 4.

Unlike the first preferred embodiment, the piezoelectric substrate 21 includes tapered portions 22 formed by chamfering corners of the principal surface 21b not having the wiring pattern provided thereon. The tapered portions 22 are inclined surfaces extending obliquely from the outer edges of the principal surface 21b of the piezoelectric substrate 21 not having the wiring pattern provided thereon. Due to the tapered portions 22, the area of the principal surface 21b not having the wiring pattern provided thereon is less than the area of the principal surface 21a having the wiring pattern provided thereon.

Figure 6:
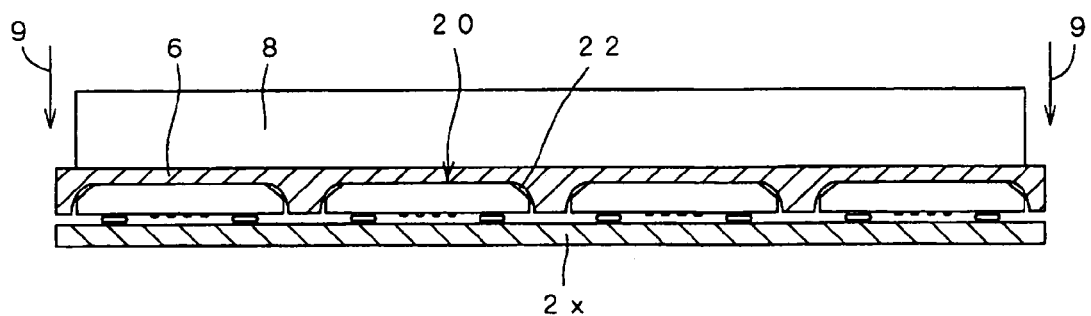
FIG. 6 illustrates a method of producing surface acoustic wave filters according to another preferred embodiment of the present invention.

Similar to the first preferred embodiment, as shown in FIG. 6, surface acoustic wave filters 1b can be fabricated by the heat press method. More specifically, a plurality of device chips 20 which are spaced apart from each other are mounted to a board aggregate 2x by the flip chip pound mounting method. The device chips 20 are covered with a resin film 6. The resin film 6 is heated and pressed towards the board assembly 2x in the direction of arrows 9 with a hot press 8 or by roll lamination in order to seal the device chips 20. By simultaneously dicing portions of the board aggregate 2x and portions of the resin film 6 between the adjacent device chips 20 perpendicularly to the board aggregate 2x, the surface acoustic wave filters 1b are severed from each other.

Since, by providing the piezoelectric substrate 21 with the tapered portions 22, the resin film 6 is successively pressed along the tapering portions 22 when pressing the heated resin film 6, the volume of air that the resin film 6 takes in is greatly reduced. As a result, the size of voids 6b that affect the sealing width are greatly reduced, such that the filter is more reliable, especially in terms of moisture resistance.

Figure 7:
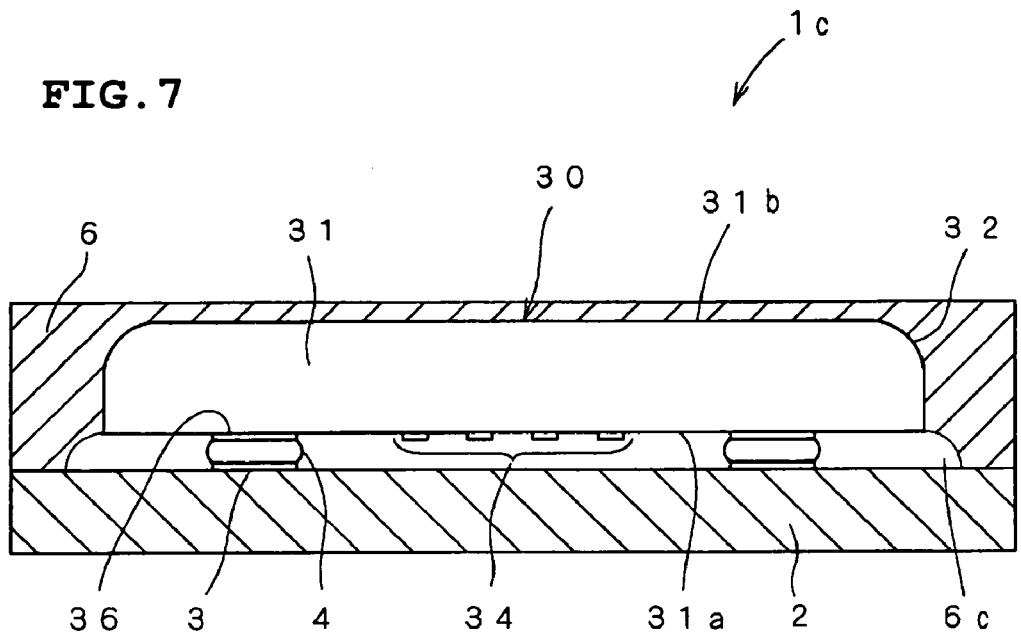
FIG. 7 is a sectional view of a modification of the surface acoustic wave filter according to a preferred embodiment of the present invention.

Although, in FIGS. 5 and 6, the corners of the piezoelectric substrate 21 include tapered portions 22 that are linear in cross section, the corners of a piezoelectric substrate 31 may be rounded by providing curved portions 32 that are curved in cross section as in a surface acoustic wave filter 1c shown in FIG. 7. In this case, the area of the principal surface 31b not having a wiring pattern including, for example, IDTs 34 and pads 36 is less than the area of the principal surface 31b having the wiring pattern, such that, similarly to the case in which the tapered portions 22 are provided, voids 6c are greatly reduced.

The tapered portions 22 and the curved portions 32 may be formed by dicing. In this case, dicer blades having cutting edges that are designed for forming the tapered portions 22 and the curved portions 32, respectively, are preferably used. For example, the tapered portions 22 may be formed using a dicer blade having V-shaped cross section.

The tapered portions 22 and the curved portions 32 may be formed by acid etching or dry etching using Ar gas. In this case, print masks having opening patterns that are designed for forming the tapered portions 22 and the curved portions 32, respectively, (such as a print mask whose density is varied according to the etching depth) are preferably used. When forming the tapering portions 22 or the curved portions 32 by dicing, since processing is performed along four sides when, for example, the rectangular piezoelectric substrate 21 or the rectangular piezoelectric substrate 31 is used, ridge lines are formed near the corners of the principal surface 21b or the principal surface 31b. When etching is performed, a continuous configuration not having such ridge lines is easily formed.

As described above, the areas of the principal surfaces 11b, 21b, and 31b not having the respective wiring patterns are less than the areas of the principal surfaces 11a, 21a, and 31a having the respective wiring patterns, such that the formation of large voids is prevented when pressing the resin sheets 6 covering the respective device chips 10, 20, and 30 while the resin sheets 6 are being heated.

While the present invention has been described with respect to preferred embodiments, it will be apparent to those skilled in the art that the disclosed invention may be modified in numerous ways and may assume many embodiments other those specifically set out and described above. Accordingly, it is intended by the appended claims to cover all modifications of the present invention which fall within the true spirit and scope of the invention.

The invention claimed is:

1. A surface acoustic wave filter comprising:
a mount board including a land;
a device chip in which a wiring pattern including an IDT and a pad electrically connected to the IDT is provided on one of a pair of parallel and opposing principal surfaces of a piezoelectric substrate, the pad being disposed so as to oppose the land of the mount board, the pad and the land being electrically connected through a bump; and
a resin film covering the other principal surface of the piezoelectric substrate and sealing the device chip; wherein
an area of the one of the principal surfaces of the piezoelectric substrate is greater than an area of the other principal surface of the piezoelectric substrate;
each peripheral surface of the piezoelectric substrate extending between the pair of principal surfaces includes a parallel planar portion which is substantially parallel to the pair of principal surfaces of the piezoelectric substrate and a vertical planar portion which is substantially perpendicular to the pair of principal surfaces of the piezoelectric substrate, such that each of the peripheral surfaces of the piezoelectric substrate includes a stepped portion including at least one step; and
a thickness of the at least one step is substantially 50%±15% of a thickness of the piezoelectric substrate.

2. The surface acoustic wave filter according to claim 1, wherein the piezoelectric substrate is made of one of $LiTaO_3$ and $LiNbO_3$.

3. The surface acoustic wave filter according to claim 1, wherein the land is made of Au.

4. The surface acoustic wave filter according to claim 1, wherein the bump is made of one of Au and solder.

5. A surface acoustic wave filter comprising:
a mount board including a land;
a device chip in which a wiring pattern including an IDT and a pad electrically connected to the IDT is provided on one of a pair of parallel and opposing principal surfaces of a piezoelectric substrate, the pad being disposed so as to oppose the land of the mount board, the pad and the land being electrically connected through a bump; and
a resin film covering the other principal surface of the piezoelectric substrate and sealing the device chip; wherein
an area of the one of the principal surfaces of the piezoelectric substrate is greater than an area of the other principal surface of the piezoelectric substrate; and
each peripheral surface of the piezoelectric substrate extending between the pair of principal surfaces includes a curved portion extending along an outer edge of the other principal surface of the piezoelectric substrate.

6. The surface acoustic wave filter according to claim 5, wherein the piezoelectric substrate is made of one of $LiTaO_3$ and $LiNbO_3$.

7. The surface acoustic wave filter according to claim 5, wherein the land is made of Au.

8. The surface acoustic wave filter according to claim 5, wherein the bump is made of one of Au and solder.

* * * * *